United States Patent
Nakano et al.

(10) Patent No.: US 11,251,083 B2
(45) Date of Patent: Feb. 15, 2022

(54) WORKPIECE PROCESSING METHOD AND DEVICE CHIP MANUFACTURING METHOD

(71) Applicant: DISCO CORPORATION, Tokyo (JP)

(72) Inventors: Kenta Nakano, Tokyo (JP); Hideyuki Kawaguchi, Tokyo (JP); Yuki Ikeda, Tokyo (JP); Toshiyuki Yoshikawa, Tokyo (JP); Senichi Ryo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 77 days.

(21) Appl. No.: 16/704,618

(22) Filed: Dec. 5, 2019

(65) Prior Publication Data
US 2020/0185277 A1  Jun. 11, 2020

(30) Foreign Application Priority Data
Dec. 6, 2018 (JP) .............................. JP2018-229005

(51) Int. Cl.
| | | |
|---|---|---|
| *H01L 21/82* | (2006.01) | |
| *H01L 21/56* | (2006.01) | |
| *H01L 21/306* | (2006.01) | |
| *H01L 21/683* | (2006.01) | |

(52) U.S. Cl.
CPC ........ *H01L 21/82* (2013.01); *H01L 21/30617* (2013.01); *H01L 21/56* (2013.01); *H01L 21/6836* (2013.01)

(58) Field of Classification Search
CPC ......... H01L 21/02076; H01L 21/30617; H01L 21/56; H01L 21/6836; H01L 21/78; H01L 21/82
See application file for complete search history.

(56) References Cited

U.S. PATENT DOCUMENTS

| | | | |
|---|---|---|---|
| 2013/0309844 A1* | 11/2013 | Takeda | B23K 26/40 438/462 |
| 2018/0342424 A1* | 11/2018 | Okita | G03F 7/091 |
| 2019/0109173 A1* | 4/2019 | Oba | H01L 21/308 |
| 2019/0157100 A1* | 5/2019 | Harikai | H01L 24/14 |

FOREIGN PATENT DOCUMENTS

| | | |
|---|---|---|
| JP | 2001085365 A | 3/2001 |
| JP | 2007123313 A | 5/2007 |
| JP | 2013239591 A | 11/2013 |

* cited by examiner

*Primary Examiner* — Mohammed Shamsuzzaman
(74) *Attorney, Agent, or Firm* — Greer, Burns & Crain, Ltd.

(57) ABSTRACT

A method of processing a workpiece includes: a frame unit preparing step of preparing a frame unit including a tape affixed to an undersurface of the workpiece; a protective film forming step of forming a protective film on a top surface of the workpiece; a cutting step of cutting the workpiece by applying a laser beam; an interval expanding step of widening intervals between chips formed in the cutting step by expanding the tape outward in a radial direction; and an etching step of removing altered regions formed in the respective chips.

11 Claims, 8 Drawing Sheets

WORKPIECE PROCESSING METHOD AND DEVICE CHIP MANUFACTURING METHOD

BACKGROUND OF THE INVENTION

Field of the Invention

The present invention relates to a processing method of processing a workpiece such as a wafer formed of a semiconductor or the like, and a device chip manufacturing method of manufacturing device chips by processing the wafer.

Description of the Related Art

A plurality of intersecting planned dividing lines are set on the top surface of a disk-shaped wafer formed of a semiconductor, a device is formed in each of regions demarcated by the planned dividing lines, and device chips can be formed when the wafer is divided along the planned dividing lines. A cutting apparatus having an annular cutting blade, for example, is used when a wafer formed of a semiconductor material such as Si, GaAs, or the like having a plurality of devices formed on a top surface thereof is divided into each device (see Japanese Patent Laid-Open No. 2001-85365). The cutting apparatus cuts a workpiece by bringing the cutting blade being rotated into contact with the workpiece. The wafer may be divided by another method. For example, the wafer can be divided when the wafer is irradiated with a laser beam of a wavelength absorbable by the wafer (wavelength that can be absorbed by the wafer), and dividing grooves are thus formed in the wafer along planned dividing lines by ablation processing (see Japanese Patent Laid-Open No. 2013-239591).

There has recently been a growing interest in a surface emitting semiconductor laser referred to as a vertical cavity surface emitting laser (VCSEL) in technical fields of optical communication, optical recording, and the like (see Japanese Patent Laid-Open No. 2007-123313). In a case where chips including VCSEL elements as devices are manufactured, a metallic film functioning as an electrode or the like is formed on the undersurface side of the wafer, and the wafer is thereafter divided.

SUMMARY OF THE INVENTION

In a case where the cutting apparatus cuts the workpiece such as the wafer having the metallic film formed on the undersurface side or the like, the cutting blade being rotated cuts into the metallic film. When the metallic film is cut by the cutting blade, the metallic film is dragged by the rotation of the cutting blade, and a projection referred to as a burr originating from the metallic film is formed from a cut surface of the metallic film, or chipping occurs at an end portion of a formed chip. The formation of the burr or the chipping degrades the quality of the chip. In addition, cutting swarf originating from the metallic film adheres to the cutting blade and causes clogging, and decreases the life of the cutting blade. Further, in a case where a relatively brittle wafer such as a GaAs wafer or the like is cut, the wafer needs to be processed under mild processing conditions in order to prevent damage to the wafer due to the cutting. The cutting of the wafer therefore takes time. On the other hand, in a case where the wafer is divided by ablation processing using a laser beam, an altered region is formed in a cut surface of a chip due to a thermal effect of the ablation processing. The flexural strength of the chip is decreased when the altered region is formed.

It is accordingly an object of the present invention to provide a workpiece processing method and a device chip manufacturing method that can efficiently form chips having a high flexural strength.

In accordance with an aspect of the present invention, there is provided a workpiece processing method of forming chips by dividing a workpiece, the workpiece processing method including: a frame unit preparing step of preparing a frame unit including the workpiece on which a planned dividing line is set, an extensible tape affixed to one of a top surface and an undersurface of the workpiece, and an annular frame having an opening and an annular region surrounding the opening, an outer peripheral portion of the tape being affixed to the annular region of the annular frame; a protective film forming step of forming a protective film by coating another of the top surface and the undersurface of the workpiece with a liquid resin; a cutting step of cutting the workpiece along the planned dividing line by irradiating the workpiece with a laser beam along the planned dividing line after the protective film forming step; an interval expanding step of widening intervals between the chips formed in the cutting step by expanding the tape outward in a radial direction after the cutting step; and an etching step of removing altered regions formed in cut surfaces of the respective chips by application of the laser beam in the cutting step by wet etching after the interval expanding step.

In addition, according to another aspect of the present invention, there is provided a device chip manufacturing method of manufacturing device chips by dividing a wafer, the device chip manufacturing method including: a frame unit preparing step of preparing a frame unit including the wafer on which a plurality of planned dividing lines intersecting each other are set, the wafer having a device formed on a top surface in each of regions demarcated by the planned dividing lines, an extensible tape affixed to one of the top surface and an undersurface of the wafer, and an annular frame having an opening and an annular region surrounding the opening, an outer peripheral portion of the tape being affixed to the annular region of the annular frame; a protective film forming step of forming a protective film by coating another of the top surface and the undersurface of the wafer with a liquid resin; a cutting step of cutting the wafer along the planned dividing lines and forming individual device chips by irradiating the wafer with a laser beam along the planned dividing lines after the protective film forming step; an interval expanding step of widening intervals between the device chips formed in the cutting step by expanding the tape outward in a radial direction after the cutting step; and an etching step of removing altered regions formed in cut surfaces of the device chips by application of the laser beam in the cutting step by wet etching after the interval expanding step.

Preferably, the wafer has a resistant layer having resistance to the wet etching on the other of the top surface and the undersurface, the protective film being formed on the other of the top surface and the undersurface in the protective film forming step, the protective film formed in the protective film forming step has water solubility, the laser beam applied to the wafer in the cutting step is a laser beam of a wavelength absorbable by the wafer, in the cutting step, the wafer is cut by ablation processing using the laser beam, and in the etching step, the protective film is removed by the wet etching.

In addition, preferably, the protective film has resistance to the wet etching, and in the etching step, the protective film protects the other of the top surface and the undersurface of the wafer from the wet etching.

In addition, preferably, the protective film forming step includes a first coating step of coating the other of the top surface and the undersurface of the wafer with a first liquid resin serving as a material for a water-soluble protective film as the liquid resin, and a second coating step of coating the other of the top surface and the undersurface of the wafer with a second liquid resin serving as a material for a water-insoluble protective film after the first coating step.

Further, preferably, the wafer includes GaAs.

Further, preferably, the wafer has a metallic film formed on the undersurface.

In the workpiece processing method and the device chip manufacturing method according to one mode of the present invention, the wafer is cut by irradiating the workpiece such as the wafer or the like with the laser beam along the planned dividing lines in the cutting step. The cutting of the wafer by the application of the laser beam can be performed in a relatively short time. On the other hand, altered regions are formed in cut surfaces of the wafer due to a thermal effect of the application of the laser beam. The altered regions lower the flexural strength of the chips. Thus, the altered regions are removed by wet etching by performing an etching step.

However, because of very small intervals between the chips formed by cutting the wafer by the application of the laser beam, an etchant cannot sufficiently enter between the chips when the wet etching is performed. Alternatively, a long time is taken to perform the wet etching sufficiently. Accordingly, in the workpiece processing method and the device chip manufacturing method according to one mode of the present invention, an interval expanding step is performed which widens the intervals between the chips before the etching step is performed. When the intervals between the chips are widened by performing the interval expanding step, the etchant easily reaches the altered regions formed in the cut surfaces of the respective chips when the etching step is performed, so that the altered regions can be removed with high efficiency. The flexural strength of each of the chips is increased when the altered regions formed by the application of the laser beam can be removed.

Hence, the present invention provides a workpiece processing method and a device chip manufacturing method that can form chips having a high flexural strength efficiently.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1A:
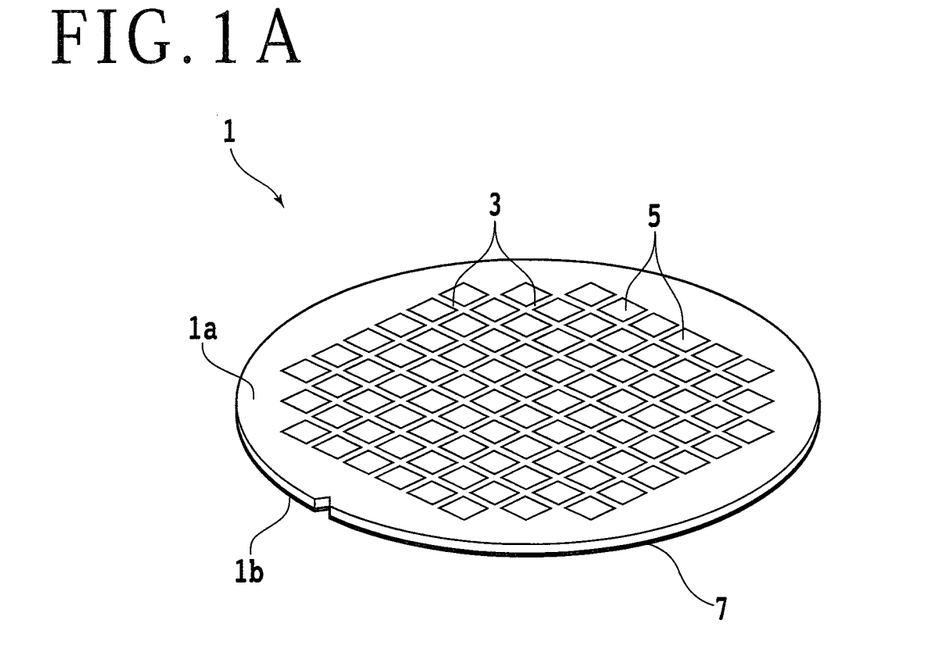
FIG. 1A is a perspective view schematically illustrating a top surface side of a wafer as a workpiece.
Figure 1B:
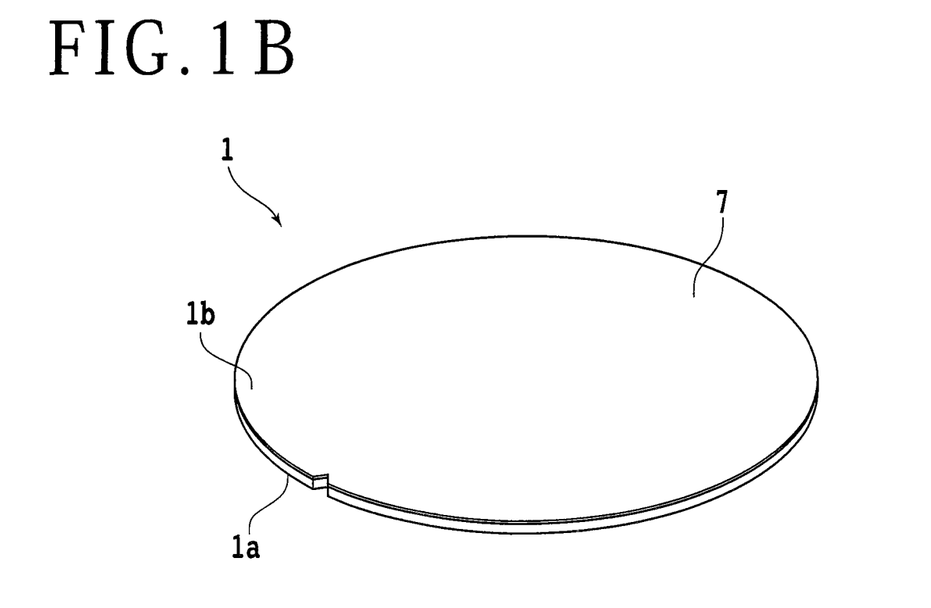
FIG. 1B is a perspective view schematically illustrating an undersurface side of the wafer as a workpiece.

An embodiment of the present invention will be described with reference to the accompanying drawings. In a workpiece processing method and a device chip manufacturing method according to the present embodiment, chips are formed by dividing a workpiece. The workpiece is, for example, a plate-shaped substrate on which planned dividing lines are set. Chips are formed when the workpiece is divided along the planned dividing lines. The workpiece is, for example, a disk-shaped wafer formed of a semiconductor material. FIG. 1A and FIG. 1B schematically illustrate, as an example of the workpiece, a wafer 1 having a plurality of devices 5 formed on a top surface $1a$ thereof. The wafer 1 is, for example, formed of a semiconductor material such as Si (silicon), SiC (silicon carbide), GaAs (gallium arsenide), GaN (gallium nitride), InP (indium phosphide), Ge (germanium), or the like.

A plurality of planned dividing lines 3 intersecting each other, for example, are formed on the wafer 1. A device 5 is formed in each of regions demarcated by the planned dividing lines 3 on the top surface $1a$ of the wafer 1. The device 5 is, for example, an integrated circuit (IC), a large-scale integrated circuit (LSI), or the like. Alternatively, the device 5 is an optical device such as a light emitting diode (LED), a VCSEL, or the like. A metallic film 7 functioning as an electrode or the like is formed on an undersurface $1b$ side of the wafer 1. When the wafer 1 is divided along the planned dividing lines 3, individual device chips having respective devices 5 are formed. However, the wafer 1 is not limited to this. There are no limitations on the material, shape, structure, size, or the like of the wafer 1. The devices 5 may not be formed on the wafer 1. In the following, description will be made of a case of dividing a GaAs wafer having devices 5 formed thereon.

Figure 2:
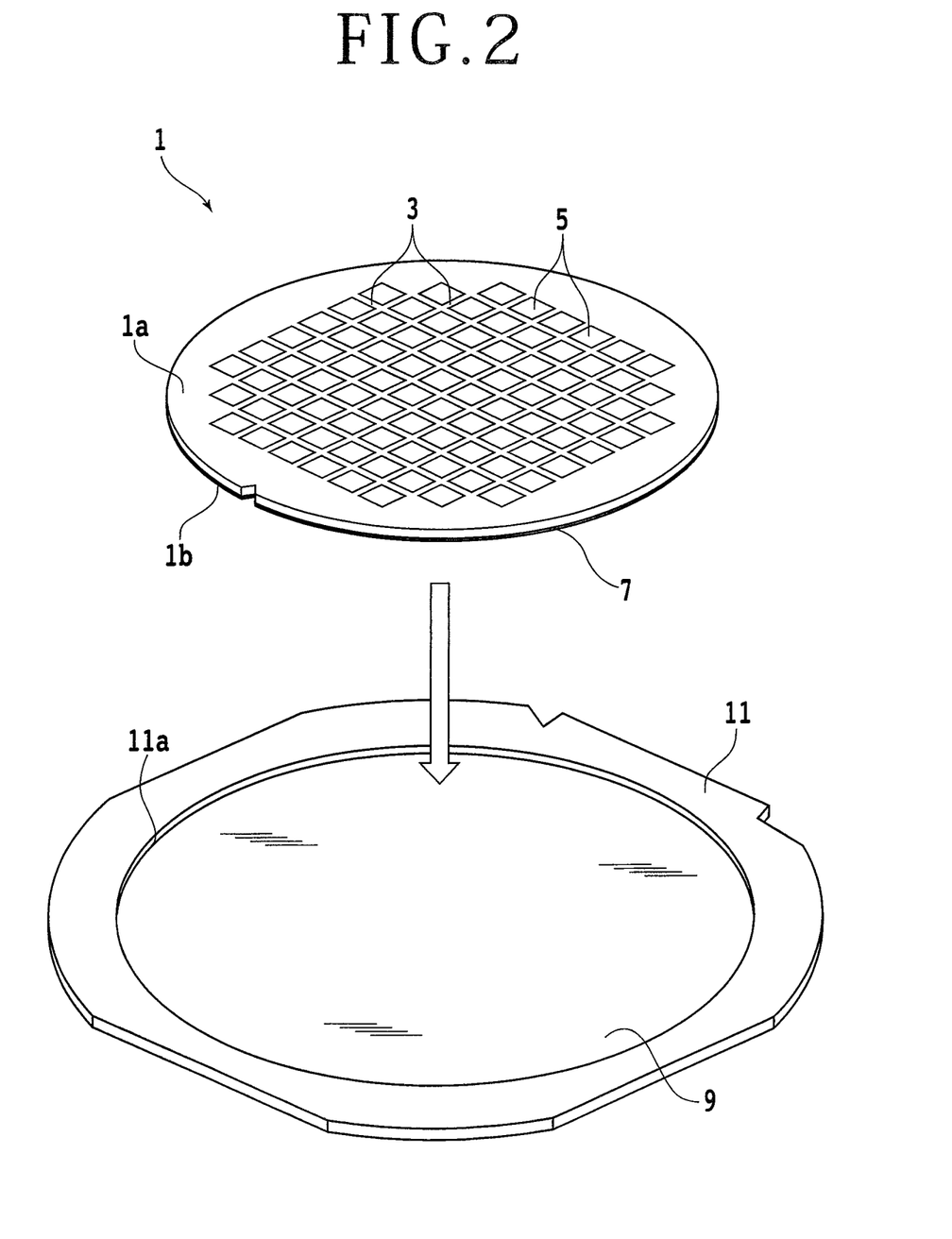
FIG. 2 is a perspective view schematically illustrating a frame unit preparing step.

An annular frame, a tape stuck to the annular frame so as to close an opening portion of the annular frame, and the wafer 1 are integrated in advance in order to facilitate handling of the wafer 1 and formed chips when the wafer 1 is divided. A lower part of FIG. 2 schematically illustrates a frame 11 and a tape 9. The frame 11 is, for example, formed of a material such as a metal or the like. A circular opening portion $11a$ having a larger diameter than that of the wafer 1 as a workpiece is formed in the frame 11. The tape 9 includes an extensible base material in the form of a film and a glue layer (adhesive layer) formed on one surface of the base material. Used as the base material of the tape 9 is, for example, polyolefin, polyethylene terephthalate, polyvinyl chloride, polystyrene, or the like. In addition, used as the glue layer of the tape 9 is, for example, a silicone rubber, an acrylic-based material, an epoxy-based material, or the like.

The wafer 1 is subjected to laser ablation processing, cleaning, and wet etching, as will be described later. Therefore, the tape 9 stuck to the wafer 1 is preferably a material having resistance to these processes. Alternatively, suitably used as the tape 9 is an ultraviolet (UV) type (cured by ultraviolet rays) dicing tape "D-765," "D-181," or "D-510T" and a non-UV type dicing tape "G-765" or "G-967" manufactured by Lintec Corporation, a UV type dicing tape "DU-300" from Nitto Denko Corporation, a UV type dicing tape "UHP-1515M3" from Denka Company Limited., a UV type dicing tape "N6801" from Sumitomo Bakelite Co., Ltd., or the like. A UV type dicing tape is particularly suitably used as the tape 9. In a case where a UV type dicing tape is used as the tape 9, the tape 9 is cured by irradiating the tape 9 with ultraviolet rays to facilitate peeling when the individual device chips formed from the wafer 1 are peeled off the tape 9.

The tape 9 has a larger diameter than that of the opening portion 11a of the frame 11. An outer peripheral portion of the tape 9 is affixed to an annular region on the periphery of the opening portion 11a. At this time, the affixing surface of the tape 9 is exposed in the opening portion 11a of the frame 11. The wafer 1 is affixed to the tape 9 exposed in the opening portion 11a. At this time, for example, the tape 9 is affixed to the undersurface 1b side of the wafer 1. An integral object constituted of the wafer 1 as a workpiece, the tape 9, and the frame 11 is referred to as a frame unit. The wafer 1 is supported by the frame 11 via the tape 9.

Figure 3:
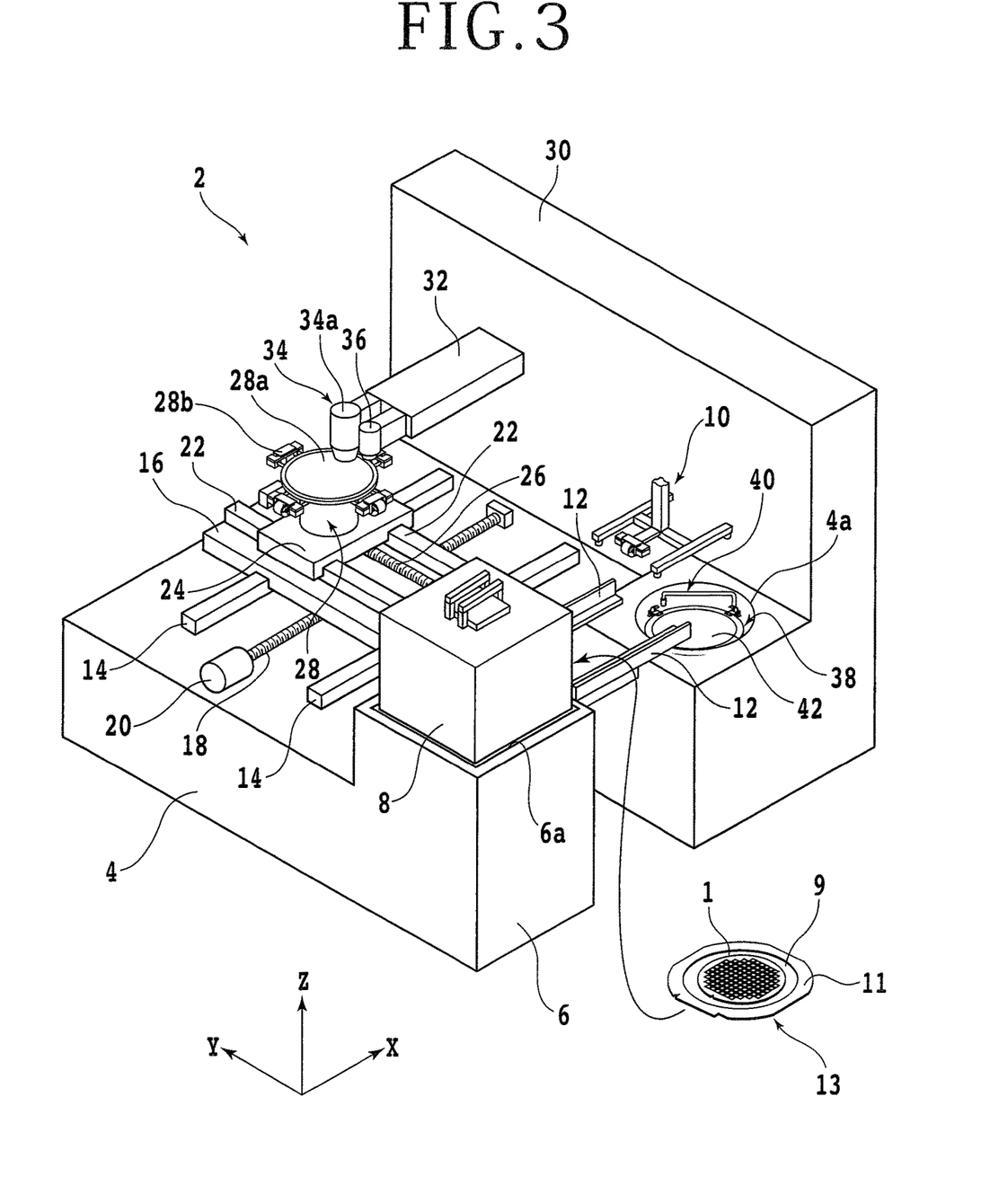
FIG. 3 is a perspective view schematically illustrating a laser processing apparatus.

The wafer 1 is divided by, for example, applying a laser beam of a wavelength absorbable by the wafer 1 (wavelength that can be absorbed by the wafer 1) along the planned dividing lines 3, and thus forming dividing grooves by ablation processing. Description will next be made of a laser processing apparatus that performs the ablation processing. FIG. 3 is a perspective view schematically illustrating a laser processing apparatus 2. The wafer 1 in a state of a frame unit 13 is carried into the laser processing apparatus 2.

The laser processing apparatus 2 includes: a chuck table 28 that sucks and holds the wafer 1 in the state of the frame unit 13; and a laser processing unit 34 disposed above the chuck table 28. The laser processing apparatus 2 includes a cassette mounting base 6a disposed on a front corner portion of a top surface of a base 4. A cassette 8 housing a plurality of wafers 1 is placed on the cassette mounting base 6a. In addition, the laser processing apparatus 2 includes: a conveying unit 10 for conveying a wafer 1 in the state of a frame unit 13 above the base 4; and conveyance rails 12.

An X-axis moving mechanism (processing feed mechanism) including X-axis guide rails 14, an X-axis moving plate 16, an X-axis ball screw 18, and an X-axis pulse motor 20 is disposed on the top surface of the base 4 of the laser processing apparatus 2. A pair of the X-axis guide rails 14 parallel with an X-axis direction is arranged on the top surface of the base 4. The X-axis moving plate 16 is slidably attached to the X-axis guide rails 14. A nut portion (not illustrated) is provided to an undersurface side of the X-axis moving plate 16. The X-axis ball screw 18 parallel with the X-axis guide rails 14 is screwed into the nut portion. The X-axis pulse motor 20 is coupled to one end of the X-axis ball screw 18. When the X-axis ball screw 18 is rotated by the X-axis pulse motor 20, the X-axis moving plate 16 moves in the X-axis direction along the X-axis guide rails 14.

A Y-axis moving mechanism (indexing feed mechanism) including Y-axis guide rails 22, a Y-axis moving plate 24, a Y-axis ball screw 26, and a Y-axis pulse motor (not illustrated) is disposed on a top surface of the X-axis moving plate 16. A pair of the Y-axis guide rails 22 parallel with a Y-axis direction is provided to a top surface of the X-axis moving plate 16. The Y-axis moving plate 24 is slidably attached to the Y-axis guide rails 22. A nut portion (not illustrated) is provided to an undersurface side of the Y-axis moving plate 24. The Y-axis ball screw 26 parallel with the Y-axis guide rails 22 is screwed into the nut portion. The Y-axis pulse motor is coupled to one end of the Y-axis ball screw 26. When the Y-axis ball screw 26 is rotated by the Y-axis pulse motor, the Y-axis moving plate 24 moves in the Y-axis direction along the Y-axis guide rails 22.

The chuck table 28 is disposed on the Y-axis moving plate 24. A porous member (not illustrated) is disposed on a top surface side of the chuck table 28. Alternatively, a plurality of grooves are formed on the top surface side of the chuck table 28. The chuck table 28 is, for example, formed by a stainless steel, a quartz member, or the like. The top surface of the chuck table 28 constitutes a holding surface 28a holding the wafer 1. The chuck table 28 is rotatable about an axis perpendicular to the holding surface 28a. The chuck table 28 has a suction source (not illustrated) connected to the porous member or the grooves. When the wafer 1 is placed on the holding surface 28a via the tape 9, and a negative pressure produced by the suction source is made to act on the wafer 1 through holes of the porous member or the grooves, the wafer 1 is sucked and held by the chuck table 28. In addition, clamps 28b that fix the frame 11 constituting the frame unit 13 are provided on the periphery of the chuck table 28.

An erect portion 30 supporting the laser processing unit 34 is disposed on a rear portion of the top surface of the base 4 of the laser processing apparatus 2. A base end side of a supporting portion 32 extending to a position above the chuck table 28 is connected to an upper portion of the erect portion 30. The laser processing unit 34 and an imaging unit 36 are arranged on a distal end side of the supporting portion 32. The laser processing unit 34 includes a processing head 34a disposed above the chuck table 28 and the imaging unit 36 disposed in a position adjacent to the processing head 34a.

The laser processing unit 34 has functions of pulse-oscillating a laser beam of a wavelength absorbable by the wafer 1 (wavelength that can be absorbed by the wafer 1), and condensing the laser beam on the wafer 1 held by the chuck table 28. For example, the laser processing unit 34 oscillates a laser using neodymium-doped yttrium aluminum garnet (Nd:YAG), neodymium-doped yttrium orthovanadate (Nd:YVO4), or the like as a laser medium, and condenses a laser beam of, for example, a wavelength of 532 nm or 355 nm or the like on the wafer 1. The imaging unit 36 has a function of imaging the wafer 1 held by the chuck table 28. The use of the imaging unit 36 enables alignment to be performed which adjusts the position of the wafer 1 with respect to the processing head 34a so that the laser beam can be applied along the planned dividing lines 3 of the wafer 1.

The laser processing apparatus 2 includes a protective film coating and cleaning unit 38 in the top surface of the base 4. The protective film coating and cleaning unit 38 has a function of forming a protective film by coating the top surface of the wafer 1 before processing with a liquid resin and a function of cleaning the wafer 1 after the processing. The protective film coating and cleaning unit 38 includes a table 42 on which the wafer 1 is placed and a nozzle 40 that jets a fluid to the wafer 1 mounted on the table 42.

The table 42 can rotate about an axis along a direction perpendicular to the mounting surface of the wafer 1. The nozzle 40 includes: a shaft portion extending in a Z-axis direction (vertical direction) on the outside of the table 42; an arm portion extending in a horizontal direction perpendicular to the Z-axis direction from an upper portion of the shaft portion; and a discharge port disposed at an end of the arm portion and facing downward in the Z-axis direction. The discharge port can be moved in the horizontal direction above the table 42 by rotating the shaft portion. The nozzle 40 is formed in the shape of a pipe. The nozzle 40 can feed a liquid supplied from a supply source connected to a lower portion of the shaft portion to the discharge port, and discharge the liquid from the discharge port to the wafer 1 held on the table 42. The nozzle 40, for example, discharges, to the wafer 1, a liquid resin as a material for a protective film for protecting the top surface 1a of the wafer 1 or a cleaning liquid for cleaning the wafer 1. Incidentally, the nozzle 40 may discharge a mixed fluid of liquid and gas to the wafer 1.

Figure 8:
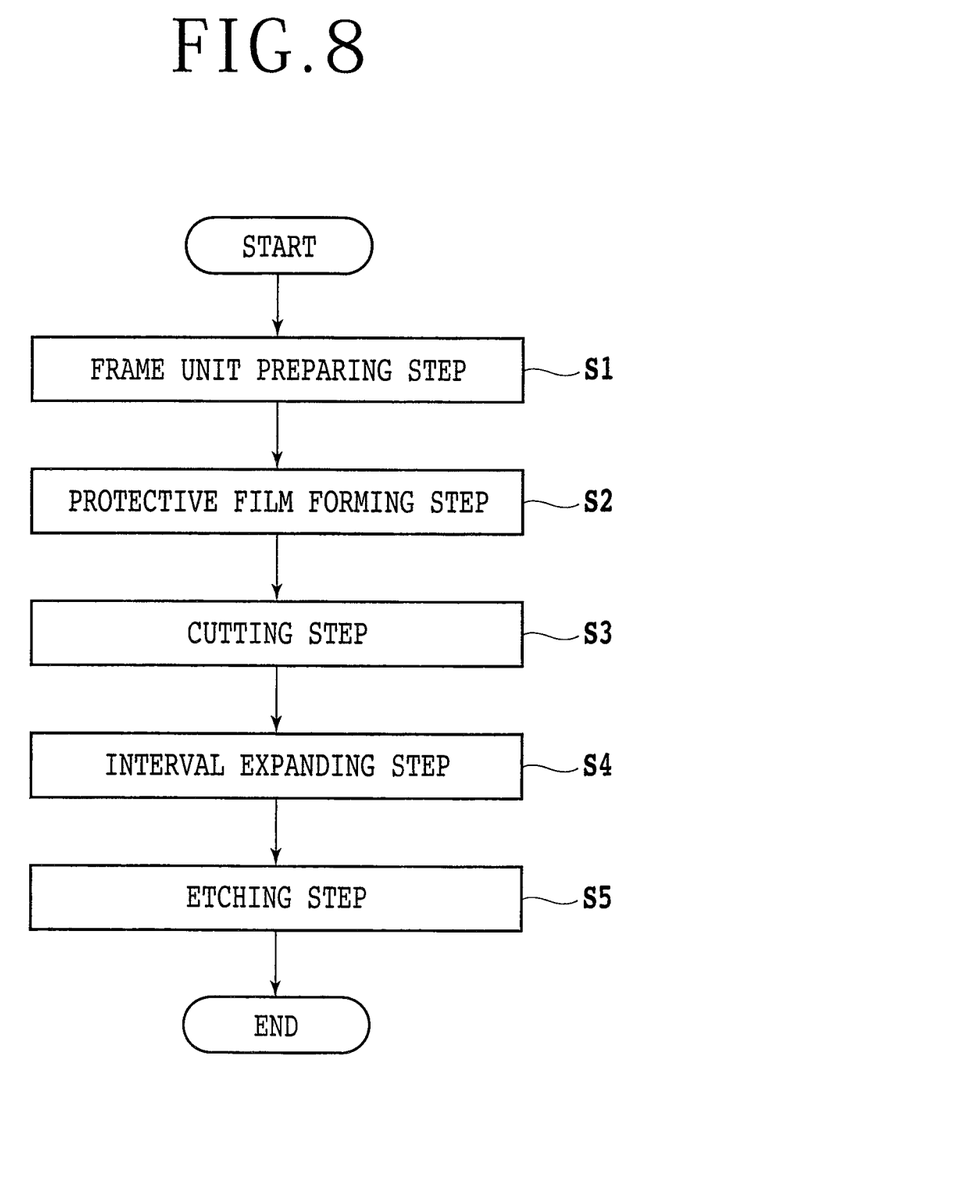
FIG. 8 is a flowchart of assistance in explaining an example of a workpiece processing method.

The workpiece processing method and the device chip manufacturing method according to the present embodiment will next be described. FIG. 8 is a flowchart illustrating an example of a flow of steps in the workpiece processing method and the device chip manufacturing method. The workpiece processing method and the device chip manufacturing method according to the present embodiment first perform a frame unit preparing step S1 of preparing a frame unit 13. FIG. 2 is a perspective view schematically illustrating the frame unit preparing step S1. In the frame unit preparing step S1 illustrated in FIG. 2, the outer peripheral portion of a tape 9 is affixed to an annular region on the periphery of an opening portion 11a of an annular frame 11 in advance, and the undersurface 1b side of a wafer 1 as a workpiece is affixed to the glue layer of the tape 9 exposed in the opening portion 11a of the frame 11. The formed frame unit 13 is, for example, housed in the cassette 8 illustrated in FIG. 3. The cassette 8 has a function of housing a plurality of frame units 13.

However, the frame unit preparing step S1 is not limited to this. For example, in the frame unit preparing step S1, the tape 9 may be affixed to the top surface 1a side of the wafer 1. In addition, the tape 9 may be affixed to the wafer 1 in advance, and next the outer peripheral portion of the tape 9 may be affixed to the annular region surrounding the opening portion 11a of the frame 11. In the following, description will be made by taking as an example a case where the tape 9 is affixed to the undersurface 1b side of the wafer 1.

The workpiece processing method and the device chip manufacturing method according to the present embodiment next perform a protective film forming step S2. In the protective film forming step S2, a protective film is formed by coating the top surface 1a of the wafer 1 as a workpiece with a liquid resin. As will be described later, the protective film has a function of protecting the top surface 1a of the wafer 1 from an etchant when wet etching of the wafer 1 is performed. The protective film forming step S2 is performed by the laser processing apparatus 2 illustrated in FIG. 3, for example. In the protective film forming step S2, the cassette 8 housing the frame units 13 is placed on the cassette mounting base 6a of the laser processing apparatus 2, and the conveying unit 10 takes out a frame unit 13 housed in the cassette 8. Then, the conveying unit 10 carries the frame unit 13 onto the table 42 of the protective film coating and cleaning unit 38.

Figure 4A:
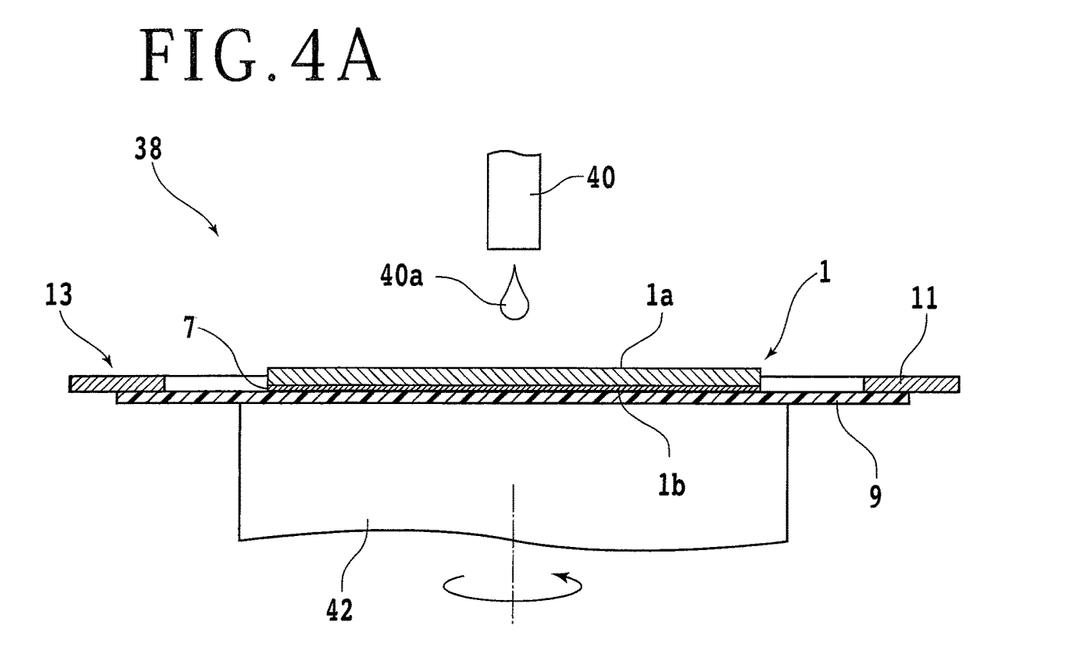
FIG. 4A is a sectional view schematically illustrating a protective film forming step.
Figure 4B:
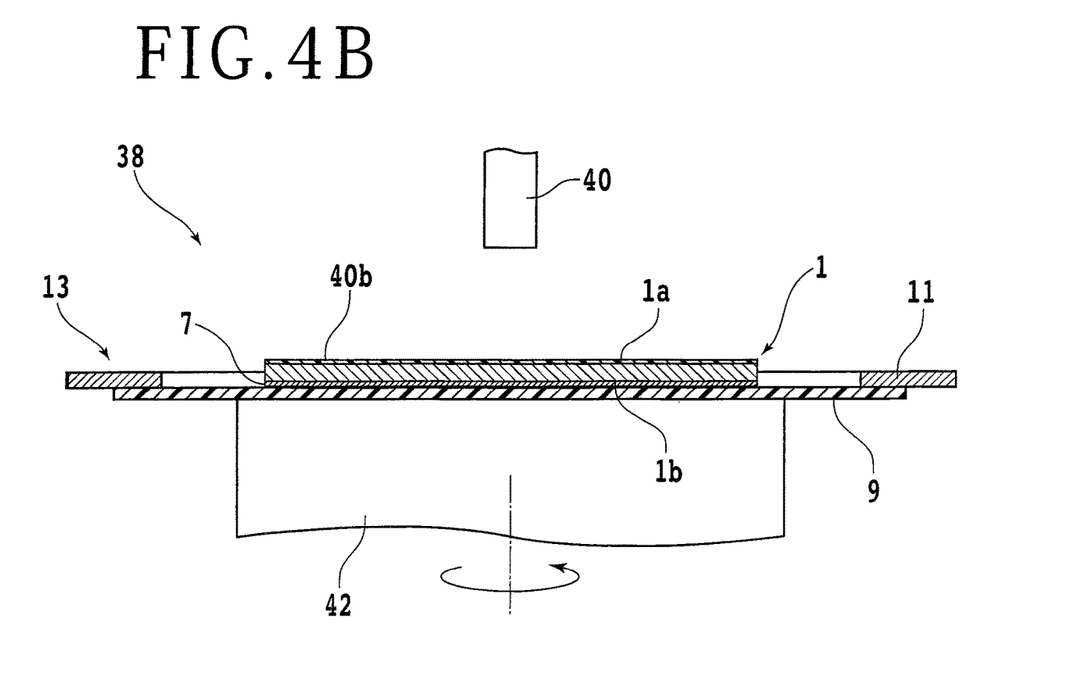
FIG. 4B is a sectional view schematically illustrating the wafer on which a protective film is formed.

Next, the wafer 1 is coated with a liquid resin as a raw material for a protective film. FIG. 4A is a sectional view schematically illustrating the protective film forming step S2. The liquid resin 40a is applied by spin coating, for example. First, the liquid resin 40a is supplied from the discharge port of the nozzle 40 to the vicinity of a center of the top surface 1a of the wafer 1 while the table 42 is rotated about an axis along the vertical direction (Z-axis direction). In this case, the liquid resin moves in an outer circumferential direction due to a centrifugal force, and the top surface 1a of the wafer 1 is coated with the liquid resin with a substantially uniform thickness. FIG. 4B is a sectional view schematically illustrating the wafer 1 on which a protective film 40b is formed in the protective film forming step S2. Incidentally, the protective film 40b may be formed by another method, and may be formed by spray coating, for example.

In the protective film forming step S2, the protective film 40b may be cured by heating and drying after the protective film 40b is formed on the top surface 1a of the wafer 1. The heating of the protective film 40b is performed by, for example, pulse irradiation of a xenon lamp, infrared irradiation, baking, or the like. When the protective film 40b is cured, adhesion thereof to the top surface 1a of the wafer 1 is enhanced, so that the protective film 40b can be prevented from being unexpectedly peeled off in each subsequent step.

When the ablation processing of the wafer 1 is performed as will be described later, the laser beam passing through the protective film 40b melts and evaporates the wafer 1, and a shock wave occurs. At this time, the shock wave occurring from the wafer 1 applies a pressure to the protective film 40b, and there is a fear that the protective film 40b may rupture and the protective film 40b may peel off in the vicinity of a position irradiated with the laser beam. Accordingly, the protective film 40b preferably includes a material (hereinafter, referred to as a light absorbing agent) having a property of absorbing the wavelength of the laser beam applied to the wafer 1 when the ablation processing of the wafer 1 is performed as will be described later. The protective film 40b including the light absorbing agent is decomposed by heat due to the application of the laser beam. Thus, a rupture caused by the shock wave does not occur, and the protective film 40b does not peel off easily. For example, in a case where the wavelength of the laser beam is 355 nm, a ferulic acid, a caffeic acid, or the like can be used as the light absorbing agent. In addition, in a case where the wavelength of the laser beam is 532 nm, Solvent Black 3, phthalocyanine, or the like can be used as the light absorbing agent.

In addition, it is preferable that the protective film 40b have resistance to wet etching to be described later and be easily removable by a predetermined method. For example, the protective film 40b is a liquid resin soluble in an organic solvent, a liquid resin soluble in an alkaline solution, or a liquid resin soluble in high-temperature water. Concrete examples of the protective film 40b will be enumerated in the following. However, the protective film 40b is not limited to the following.

Liquid resins soluble in an organic solvent include, for example, polymethyl methacrylate, polyethylene terephthalate, polyvinyl butyral, polyimide, polystyrene, polyethylene, polypropylene, polyurethane, epoxy resin, and the like. Liquid resins soluble in an alkaline solution include, for example, "UC-3000," "UC-3080," "UC-3510," "UF-5080," and "UC-5022" of acrylic-based polymer "ARUFON (registered trademark)" manufactured by Toagosei Co., Ltd., "8KQ" and "PH" manufactured by Taisei Fine Chemical Co., Ltd., "ZAH-106," "ZAH-110," "ZAH-115," "ZAH-306," "ZAH-310," and "ZAH-315" of functional acrylic polymer "PHORET (registered trademark)" manufactured by Soken Chemical & Engineering Co., Ltd., and the like. Further, liquid resins soluble in an alkaline solution include resins "CH-9," "M-5D," and "M-4" based on a vinyl acetate polymer and manufactured by Denki Kagaku Kogyo Kabushiki Kaisha, reactive polymers "RP-274S" and "RP-310" manufactured by KSM Co., Ltd., an acrylic-based resin "BT-9" manufactured by DSM Coating Resins, LLC, and the like.

Further, a liquid resin soluble in an alkaline solution may be produced by using an additive that can be added to a resin material to prepare the liquid resin soluble in the alkaline solution. Such additives include, for example, alkali-soluble thickeners "VONCOAT (registered trademark) HV-E," "VONCOAT (registered trademark) V-E," and "VONCOAT (registered trademark) 3750-E" manufactured by DIC Corporation, an acid anhydride "H-TMAn" manufactured by Mitsubishi Gas Chemical Company, Inc., and the like. In addition, liquid resins soluble in high-temperature water include, for example, acrylic-based resins "NW-112B," "NW-115NH-100S," "NW-126-100S," and "NW-128" manufactured by Denki Kagaku Kogyo Kabushiki Kaisha, epoxy adhesives "U-BOND" and "B-BOND" and an acrylic resin-based adhesive "SKYLOCK RD series" manufactured by Nikka Seiko Co., Ltd., and the like.

Incidentally, while description has been made of a case where the tape 9 is affixed to the undersurface 1b side of the wafer 1 to form the protective film 40b on the top surface 1a side of the wafer 1, the workpiece processing method and the device chip manufacturing method according to the present embodiment are not limited to this. The tape 9 may be affixed to the top surface 1a side of the wafer 1, and the protective film 40b may be formed on the undersurface 1b side of the wafer 1. That is, the tape 9 is affixed to one of the top surface 1a and the undersurface 1b of the wafer 1, and the protective film 40b is formed on the other of the top surface 1a and the undersurface 1b of the wafer 1.

The workpiece processing method and the device chip manufacturing method according to the present embodiment perform a cutting step S3 after the protective film forming step S2. After the protective film forming step S2 is performed, the conveying unit 10 conveys the frame unit 13, onto the holding surface 28a of the chuck table 28. Then, the wafer 1 as a workpiece is sucked and held via the tape 9 by actuating the suction source of the chuck table 28, and the frame 11 is grasped by the clamps 28b. Next, the chuck table 28 is moved to a position below the laser processing unit 34, and information about the position of a planned dividing line 3 is obtained by imaging the top surface 1a of the wafer 1 by the imaging unit 36. Then, on the basis of the information, the planned dividing line 3 is aligned with the processing feed direction (X-axis direction) by rotating the chuck table 28 about an axis along a direction perpendicular to the holding surface 28a. Together with this, the processing head 34a is positioned above an extension of the planned dividing line 3 by moving the chuck table 28.

Figure 5A:
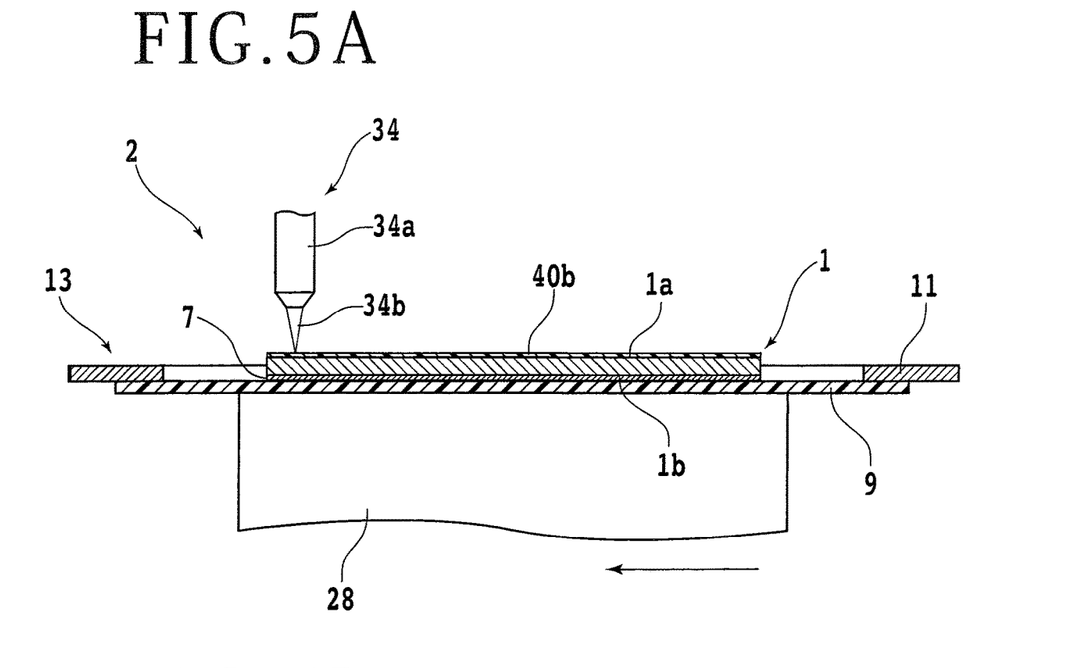
FIG. 5A is a sectional view schematically illustrating a cutting step.

FIG. 5A is a sectional view schematically illustrating the cutting step S3. The wafer 1 as a workpiece is irradiated with a laser beam 34b along the planned dividing line 3 by moving the chuck table 28 along the processing feed direction while the laser processing unit 34 is made to oscillate a laser. When the laser beam 34b of a wavelength absorbable by the wafer 1 is applied along the planned dividing line 3, a processed groove is formed in the wafer 1 by ablation. Incidentally, the laser beam 34b may be applied to the planned dividing line 3 twice or more. After the ablation processing is performed along one planned dividing line 3, the chuck table 28 is moved along an indexing feed direction (Y-axis direction), and the ablation processing is similarly performed along another planned dividing line 3. After the ablation processing is performed along all of planned dividing lines 3 along the X-axis direction, the chuck table 28 is rotated, and the processing is similarly performed along planned dividing lines 3 along another direction. Then, processed grooves are formed along all of the planned dividing lines 3.

Figure 5B:
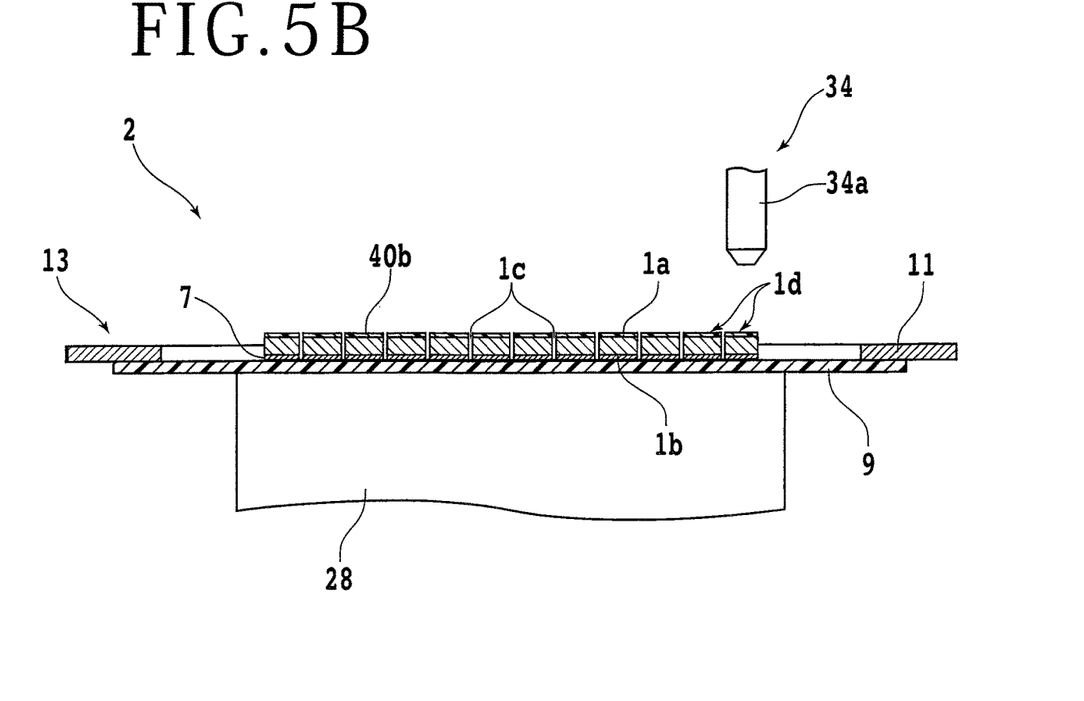
FIG. 5B is a sectional view schematically illustrating the wafer that has been cut.
Figure 7A:
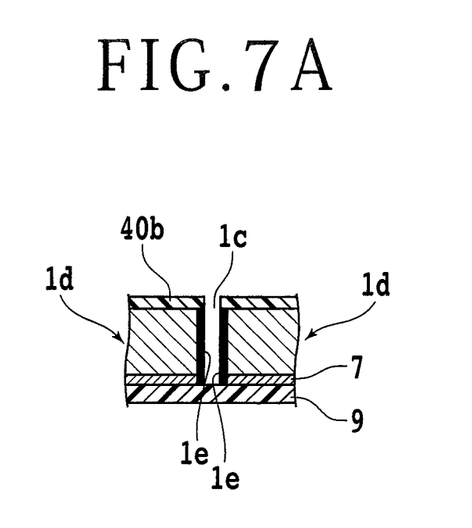
FIG. 7A is an enlarged sectional view schematically illustrating an interval between chips before the interval is expanded.

FIG. 5B is a sectional view schematically illustrating the wafer 1 divided into chips 1d by forming processed grooves 1c penetrating the wafer 1 in a thickness direction. In the case where the devices 5 are formed on the wafer 1, the chips 1d become device chips. When the processed grooves 1c are formed by the application of the laser beam 34b, an altered region is formed in cut surfaces of the chips 1d (wafer 1) due to a thermal effect accompanying the application of the laser beam 34b. FIG. 7A is a sectional view schematically illustrating, on an enlarged scale, chips 1d having an altered region 1e formed in a cut surface. Fine cracks are formed in the altered region 1e. The chips 1d having the altered region 1e formed in the cut surface are therefore relatively low in flexural strength. Accordingly, wet etching may be performed to remove the altered regions 1e. However, the processed grooves 1c have a very small width, so that it is difficult for an etchant to enter the processed grooves 1c. It is thus not easy to remove the altered regions 1e sufficiently.

Figure 6A:
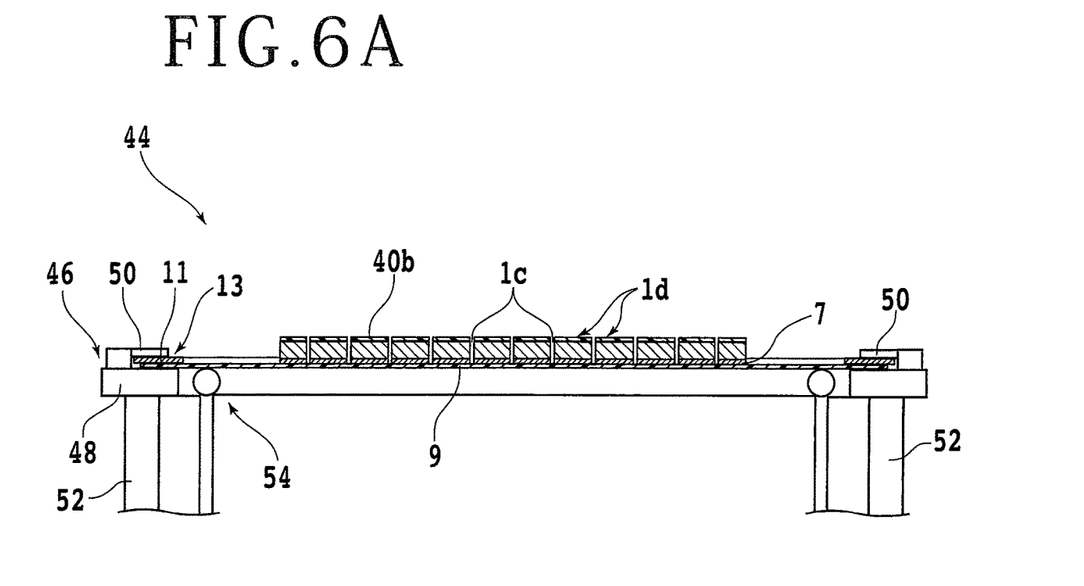
FIG. 6A is a sectional view schematically illustrating a frame unit carried into an expanding apparatus.
Figure 6B:
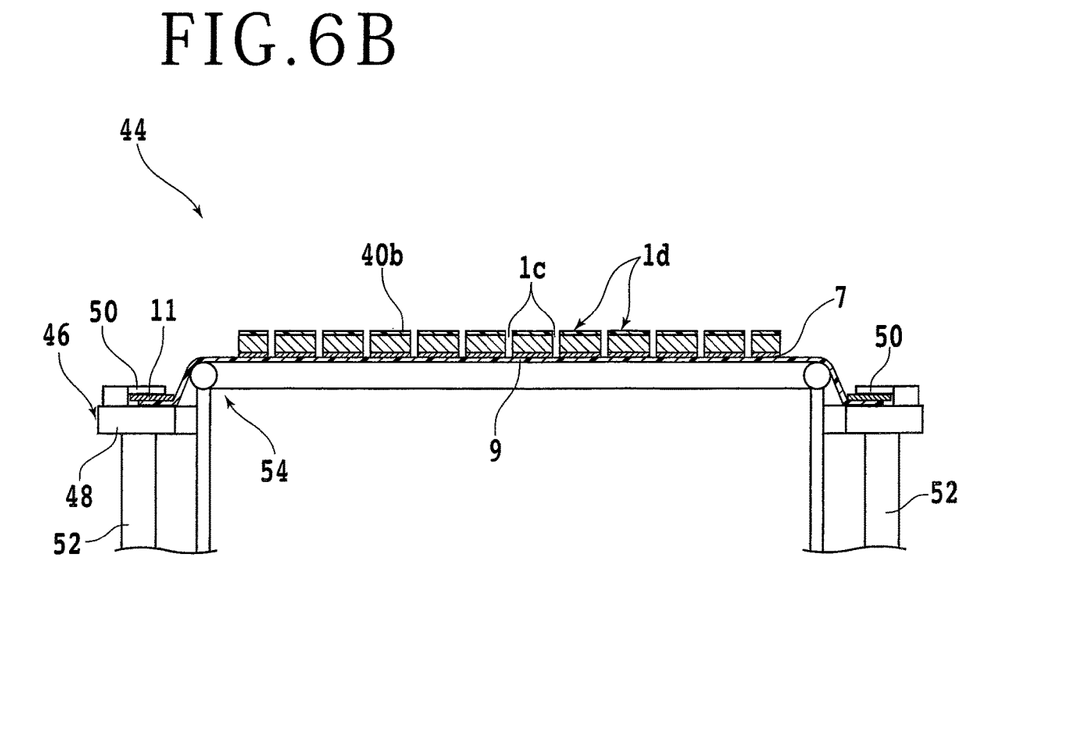
FIG. 6B is a sectional view schematically illustrating an interval expanding step.

Accordingly, the workpiece processing method and the device chip manufacturing method according to the present embodiment widen intervals between the chips 1d by performing an interval expanding step S4 so that an etchant easily enters the processed grooves 1c. The interval expanding step S4 is performed by an expanding apparatus 44 illustrated in FIG. 6A and FIG. 6B. FIG. 6A is a sectional view schematically illustrating the frame unit 13 carried into the expanding apparatus 44. FIG. 6B is a sectional view schematically illustrating the interval expanding step S4. The expanding apparatus 44 will be described. The expanding apparatus 44 includes: a cylindrical expanding drum 54 having a larger diameter than the diameter of the wafer 1; and a frame holding unit 46 including a frame support 48. The frame support 48 of the frame holding unit 46 has an opening having a larger diameter than the diameter of the expanding drum 54. The frame support 48 is disposed at a height similar to that of an upper end portion of the expanding drum 54, and surrounds the upper end portion of the expanding drum 54 from an outer circumference side.

Clamps 50 are arranged on the outer circumference side of the frame support 48. When the frame unit 13 is placed on the frame support 48, and the frame 11 of the frame unit 13 is grasped by the clamps 50, the frame unit 13 is fixed to the frame support 48. The frame support 48 is supported by a plurality of rods 52 extending along the vertical direction. In a lower end portion of each of the rods 52, an air cylinder (not illustrated) that raises and lowers the rod 52 is disposed. When the rods 52 are lowered by actuating the respective air cylinders, the frame support 48 is lowered with respect to the expanding drum 54.

Figure 7B:
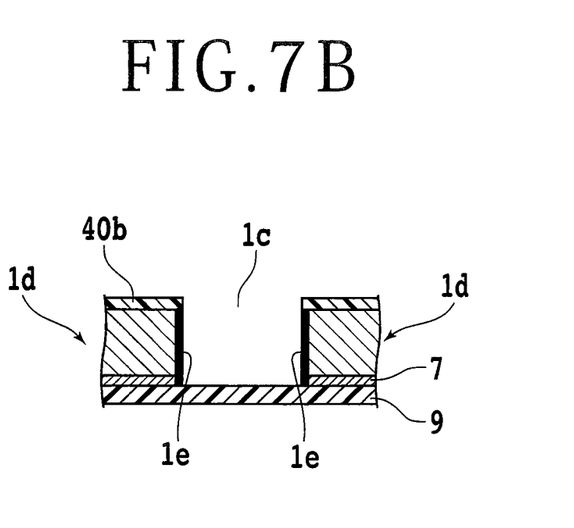
FIG. 7B is an enlarged sectional view schematically illustrating the interval between the chips after the interval is expanded.

When the interval expanding step S4 is performed, the frame unit 13 is conveyed onto the frame support 48 of the expanding apparatus 44, and the clamps 50 are made to grasp the frame 11. Next, the frame support 48 is lowered by actuating the air cylinders. Then, the tape 9 affixed to the workpiece is expanded outward in a radial direction, and the intervals between the chips 1d supported by the tape 9 are thereby widened. FIG. 7B is a sectional view schematically illustrating, on an enlarged scale, the processed grooves 1c (intervals between the chips 1d) after the interval expanding step S4 is performed. For example, the width of the processed grooves 1c immediately after the cutting step S3 is performed is approximately 5 to 15 µm, whereas the intervals between the chips 1d are expanded to approximately 15 to 50 µm by performing the interval expanding step S4. Incidentally, in order to maintain the state in which the intervals between the chips 1d are widened, in the interval expanding step S4, the annular region of the tape 9 exposed between the wafer 1 (chips 1d) and the frame 11 may be heated, and the tape 9 may be thereby shrunk in the region. In addition, before the interval expanding step S4 is performed, a tape may be replaced by peeling off the tape 9 affixed to the undersurface 1b side of the wafer 1 (chips 1d) as a workpiece and affixing another tape to the undersurface 1b of the wafer 1 (chips 1d).

The workpiece processing method and the device chip manufacturing method according to the present embodiment perform an etching step S5 after the interval expanding step S4. In the etching step S5, the altered regions 1e formed in the cut surfaces of the respective chips 1d due to the application of the laser beam 34b in the cutting step S3 are removed by wet etching. The etching step S5 is performed by a wet etching apparatus 56 illustrated in FIG. 7C. The wet etching apparatus 56 has an etching tank 58 having a bottom surface of a larger diameter than the diameter of the frame unit 13. An etchant 60 is included in the etching tank 58. The etchant 60 is a solution that can remove the altered regions 1e formed in the cut surfaces of the chips 1d. The etchant 60 is selected according to the material of the wafer 1 and the like. For example, in a case where the wafer 1 is a GaAs wafer, an aqueous solution in which a sulfuric acid or an ammonia aqueous solution, a hydrogen peroxide solution, and pure water are mixed with each other in a predetermined ratio is used as the etchant 60. Further, the etchant 60 may be selected according to the material of the protective film 40b. Alternatively, the material of the protective film 40b may be selected according to a solute of the aqueous solution used as the etchant 60.

Figure 7C:
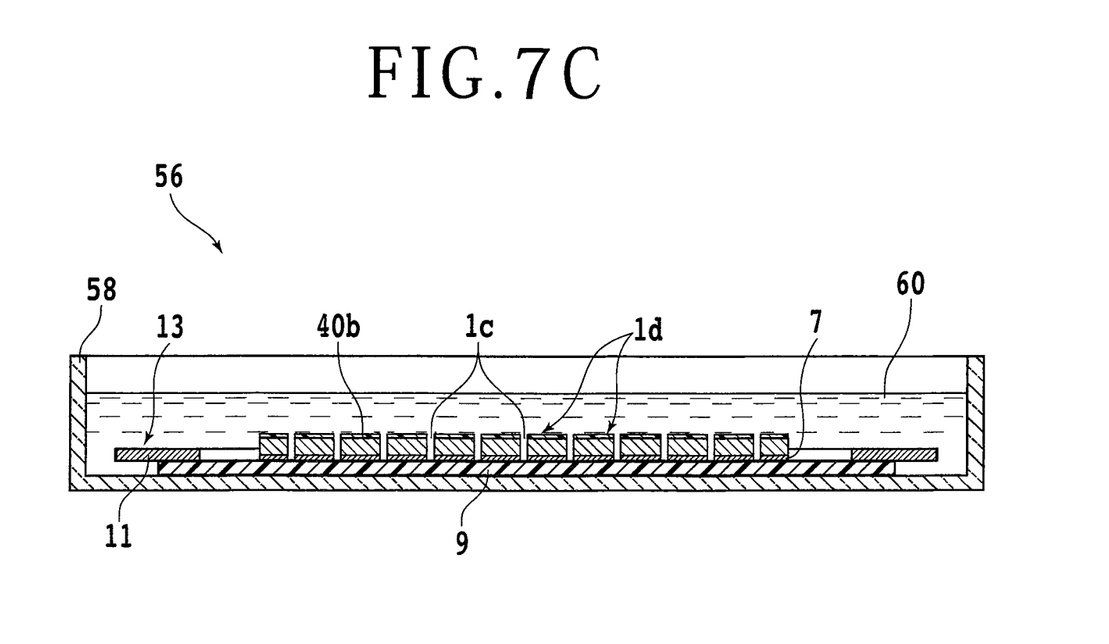
FIG. 7C is a sectional view schematically illustrating an etching step.

In the etching step S5, the frame unit 13 is carried into the etching tank 58, and the frame unit 13 is sunk into the etchant 60. Thereafter, the frame unit 13 is lifted from the etchant 60 after a predetermined time has passed, and etching is stopped by cleaning the frame unit 13 with, for example, pure water or the like. The wet etching is performed for approximately 15 seconds to 3 minutes, for example. In the workpiece processing method and the device chip manufacturing method according to the present embodiment, because the intervals between the chips 1d are widened by performing the interval expanding step S4, the etchant 60 enters between the chips 1d easily, and thus the altered regions 1e are removed easily. Because the altered regions 1e in which fine cracks are formed are removed, the flexural strength of the chips 1d is increased.

In a case where the intervals between the chips 1d are not widened without the use of the present embodiment, the wet etching needs to be performed for a relatively long time to remove the altered regions 1e by performing the wet etching sufficiently, and manufacturing efficiency of the chips 1d is decreased. In addition, when the wet etching is performed for a long time, the protective film 40b may peel off, and the chips 1d and the device 5 may be damaged by the etchant 60. On the other hand, the workpiece processing method and the device chip manufacturing method according to the present embodiment can perform the wet etching sufficiently in a relatively short time. Further, the protective film 40b does not peel off easily, and therefore damage to the chips 1d and the device 5 does not occur easily. In particular, in a case where the protective film 40b has a strong resistance to the wet etching, the protective film 40b sufficiently protects the top surface 1a of the wafer 1 (chips 1d) from the wet etching, and therefore damage to the chips 1d does not occur easily.

A protective film removing step of removing the protective film 40b may be performed after the etching step S5 is performed. For example, in a case where the protective film 40b is a liquid resin soluble in an organic solvent, the protective film 40b is removed by immersing the chips 1d in an organic solvent such as propylene glycol monomethyl ether (PGME), isopropyl alcohol (IPA), ethanol, or the like or a solution obtained by mixing water with such an organic solvent. In addition, in a case where the protective film 40b is a liquid resin soluble in an alkaline solution, for example, the protective film 40b is removed by immersing the chips 1d in an alkaline solution such as a sodium hydroxide aqueous solution, an ammonia aqueous solution, or the like. Further, in a case where the protective film 40b is a liquid resin soluble in high-temperature water, the protective film 40b is removed by immersing the chips 1d in water at a high temperature of approximately 70° C. to 90° C.

Incidentally, when the wafer 1 as a workpiece is subjected to the ablation processing by the laser beam 34b in the cutting step S3, a melt of the wafer 1, which is referred to as debris, scatters on the top surface 1a of the wafer 1, and adheres to the upper surface of the protective film 40b. A part of the debris may be removed by the wet etching. However, when the protective film removing step of removing the protective film 40b is performed, the debris is surely removed from the chips 1d together with the protective film 40b. There is thus no fear of a decrease in quality of the chips 1d due to the adhesion of the debris.

In the protective film removing step, efficiency of removal of the protective film 40b may be improved by stirring liquid that can remove the protective film 40b. In addition, in a case of high adhesion between the chips 1d and the protective film 40b, an ultrasonic wave may be applied to liquid that can remove the protective film 40b. However, the ultrasonic wave needs to be applied to the liquid under conditions where no damage occurs to the chips 1d. In addition, the protective film removing step may be performed by the protective film coating and cleaning unit 38. In this case, the frame unit 13 is conveyed to the protective film coating and cleaning unit 38, and the frame unit 13 is subjected to high pressure cleaning by using liquid that can remove the protective film 40b, for example. Further, in the protective film coating and cleaning unit 38, two-fluid cleaning may be performed which supplies a mixture of the liquid and air to the frame unit 13.

After the etching step S5 is performed, a pickup step may be performed which conveys the frame unit 13 to a pickup apparatus, and obtains the individual chips 1d by peeling off the chips 1d from the tape 9.

Incidentally, in the workpiece processing method and the device chip manufacturing method according to the present embodiment, in a case where the top surface 1a of the wafer 1 has resistance to the etchant 60, a water-soluble protective film 40b may be formed by using a water-soluble liquid resin in the protective film forming step S2. For example, in a case where the wafer 1 is a GaAs wafer, and an oxide film serving as a resistant layer having resistance to the etchant 60 is formed on the top surface 1a, a water-soluble liquid resin can be used as the protective film 40b. Debris occurring from the wafer 1 due to the ablation processing in the cutting step S3 scatters on the top surface 1a of the wafer 1, and the debris adheres to the protective film 40b. In a case where a water-soluble liquid resin is used as the protective film 40b, the protective film 40b can be removed together with the debris when the altered regions 1e of the wafer 1 (chips 1d) are subsequently removed by the etchant 60. Therefore, the protective film removing step does not need to be performed separately.

Water-soluble liquid resins include polyvinyl alcohol, polyvinylpyrrolidone, polyethylene glycol, polyacrylamide, poly-N-vinylacetamide, polyethylene oxide, methyl cellulose, ethyl cellulose, hydroxypropyl cellulose, polyacrylic acid, a polyvinyl polyacrylic acid block copolymer, a polyvinyl polyacrylic acid ester block copolymer, and the like. In addition, a water-soluble protective film material "HOGOMAX (registered trademark)" manufactured by DISCO Corporation is cited.

In addition, in the case where a water-soluble liquid resin is used as the protective film 40b, the protective film forming step S2 may coat the wafer 1 with a liquid resin as a material for a water-soluble protective film, and thereafter further coat the wafer 1 with a liquid resin as a material for a water-insoluble protective film. In this case, in the protective film forming step S2, a first coating step is first performed which coats the top surface 1a of the wafer 1 with a liquid resin as a material for a water-soluble protective film 40b. A water-soluble protective film 40b is formed when the first coating step is performed. Then, after the first coating step, a second coating step is performed which further coats the top surface 1a of the wafer 1 with a liquid resin as a material for a water-insoluble protective film. When the second coating step is performed, a water-insoluble protective film is formed on the water-soluble protective film 40b.

When the water-insoluble protective film is formed on the water-soluble protective film 40b, the water-soluble protective film 40b is protected by the water-insoluble protective film in the etching step S5. Therefore, even in a case where the top surface 1a of the wafer 1 does not have resistance to the etchant 60, the protective film 40b formed of the water-soluble liquid resin can be used. In the workpiece processing method and the device chip manufacturing method according to the present embodiment, the wet etching can be completed in a relatively short time, and therefore damage to the water-soluble protective film 40b is limited.

In a case where the liquid resin applied to the top surface 1a of the wafer 1 in the first coating step is soluble in the liquid resin applied in the second coating step, for example, the water-soluble protective film 40b and the water-insoluble protective film may be mixed with each other at about an interface. Even in this case, when an exposed upper portion of the water-insoluble protective film is sufficiently water-insoluble, the water-soluble protective film 40b is protected from the etchant 60.

Incidentally, in the case where the water-insoluble protective film is formed on the protective film 40b formed of the water-soluble liquid resin, when water is used at a time of performing the protective film removing step, the water-insoluble protective film can be peeled off by removing the water-soluble protective film 40b. A step of peeling off the water-insoluble protective film therefore becomes unnecessary. However, in order to remove the water-soluble protective film 40b protected by the water-insoluble protective film, the protective film removing step preferably performs high strength cleaning such as two-fluid cleaning, high pressure cleaning, or the like, and may perform both of two-fluid cleaning and high pressure cleaning.

Here, a resin material such, for example, as hydroxymethyl cellulose insoluble in an organic solvent, polyvinyl alcohol having a relatively high degree of saponification, or the like is used as the liquid resin in the first coating step. Alternatively, a resin material such as polyvinylpyrrolidone soluble in an organic solvent, poly-N-vinylacetamide, polyvinyl alcohol having a relatively low degree of saponification, polyethylene glycol, or the like is used. Alternatively, a water-soluble protective film material "HOGOMAX (registered trademark)" manufactured by DISCO Corporation is used. Used as the liquid resin in the second coating step is, for example, a liquid resin obtained by dissolving a resin such as polyvinyl butyral, polymethyl methacrylate, a methacrylate-ester copolymer, or the like in an organic solvent such as propylene glycol monomethyl ether, propylene glycol monomethyl ether acetate, isopropyl alcohol, or the like.

Further, one or both of the liquid resin used in the first coating step and the liquid resin used in the second coating step preferably include a material (light absorbing agent) having a property of absorbing the wavelength of the laser beam applied to the wafer 1 in the cutting step S3. The inclusion of the light absorbing agent in these liquid resins suppresses the peeling off of the protective film 40b or the like due to a shock wave caused by the ablation processing in the cutting step S3. The liquid resin used in the second coating step, in particular, preferably includes the light absorbing agent.

In addition, while description has been made of a case where the laser beam 34b of a wavelength absorbable by the wafer 1 is applied in the cutting step S3, and the processed grooves 1c are thus formed by the ablation processing, the cutting step S3 is not limited to this. That is, in the cutting step S3, the wafer 1 may be cut by another method. For example, in the cutting step S3, a laser beam of a wavelength transmissible through the wafer 1 (wavelength passing through the wafer 1) may be condensed within the wafer 1 along the planned dividing lines 3, and a modified layer (altered region) as a division starting point may be formed within the wafer 1 by a multiphoton absorption process. After the modified layer is formed, the wafer 1 can be cut by extending cracks in a thickness direction of the wafer 1 from the modified layer. Also in this case, when the modified layer (altered region 1e) or the like remains in end surfaces of formed chips 1d, cracks tend to occur in the chips 1d, so that the flexural strength of the chips 1d is decreased. Accordingly, the modified layer (altered region 1e) or the like is removed by wet etching. At this time, when intervals between the formed chips 1d are widened in advance, the etchant 60 reaches the modified layer easily, and thus the modified layer can be removed efficiently.

As described above, according to the workpiece processing method and the device chip manufacturing method in accordance with the present embodiment, chips having a high flexural strength can be formed by removing the altered regions in the cut surfaces.

First Example

In a first example, description will be made of a case where a liquid resin soluble in an organic solvent is used as the protective film 40b. In the first example, description will be made of a case where a GaAs wafer 1 is set as a workpiece, the protective film 40b is formed on the top surface 1a of the wafer 1, and the wafer 1 is cut. In the first example, the frame unit preparing step S1 was performed to form the frame unit 13 by affixing a dicing tape "D765" manufactured by Lintec Corporation as the tape 9 to the undersurface 1b side of the wafer 1 having a metallic film formed on the undersurface 1b side. Next, in the protective film forming step S2, the top surface 1a side of the wafer 1 was coated with a liquid resin formed by dissolving polyvinyl butyral (PVB) in propylene glycol monomethyl ether (PGME). Solvent Black 3 as a light absorbing agent capable of absorbing light having a wavelength of 532 nm was added to the liquid resin in advance.

The protective film forming step S2 and the cutting step S3 to be described next were performed in a laser ablation processing apparatus "DFL7161" manufactured by DISCO Corporation. Spin coating was performed for 60 seconds at a rotational speed of 2000 rpm. Thereafter, the protective film 40b soluble in an organic solvent was formed on the top surface 1a side of the wafer 1 by drying the liquid resin. A xenon pulse irradiating apparatus was used to dry the liquid resin. The xenon pulse irradiating apparatus applied xenon pulsed light for 60 seconds.

Next, in the cutting step S3, a laser was oscillated with Nd:YAG used as a laser medium, and the wafer 1 was irradiated twice (two passes) with the laser beam 34b having a wavelength of 532 nm along each planned dividing line 3. The shape of a strike mark of one pulse as a result of the application of the laser beam at that time was made to be an ellipse having a length of 1250 to 1350 μm in a direction along the planned dividing line 3 and a perpendicular length of 12 to 13 μm in a direction perpendicular to the direction along the planned dividing line 3. The ablation processing was performed by the application of the laser beam 34b to form the processed grooves 1c in the wafer 1, and the wafer 1 was thereby cut. Incidentally, laser processing conditions in a first (one pass) application of the laser beam 34b were a power of 5.5 W, a frequency of 5 kHz, a defocus (DF) amount of −0.06 mm, and a processing feed speed of 250 mm/s. Laser processing conditions in a second application (two passes) of the laser beam 34b were a power of 6.0 W, a frequency of 5 kHz, a DF amount of −0.08 mm, and a processing feed speed of 300 mm/s.

Next, in the interval expanding step S4, the wafer 1 was conveyed into the expanding apparatus 44 illustrated in FIG. 6A and FIG. 6B, and the intervals between the chips 1d of the wafer 1 were expanded. At that time, the intervals between the chips 1d were expanded from approximately 10 to 25 μm. Next, the etching step S5 was performed. First, the etchant 60 at room temperature (22° C.) was made by mixing ammonia water with a concentration of 28% to 30%, the ammonia water being manufactured by Kanto Chemical Co., Inc., a hydrogen peroxide solution with a concentration of 30%, the hydrogen peroxide solution being manufactured by Kishida Chemical Co., Ltd., and pure water in a ratio of 1:1:14, and the etchant 60 was prepared in the etching tank 58. Next, the wafer 1 was introduced into the etching tank 58, and the altered regions 1e formed in the cut surfaces of the chips 1d were removed by immersing the wafer 1 in the etchant 60 for 30 seconds. Incidentally, in the etching step S5, a similar result was also obtained when the etchant 60 at room temperature (22° C.) was made by mixing a concentrated sulfuric acid, a hydrogen peroxide solution, and pure water in a ratio of 1:10:50, and immersing the wafer 1 in the etchant 60 for 60 seconds. Next, the protective film 40b formed on the top surface 1a was removed by cleaning the chips 1d with a PGME solution. At that time, an ultrasonic wave of 46 kHz was generated for 20 seconds by using an ultrasonic cleaner. As a result of the above, the chips 1d from which the altered regions 1e were removed were fabricated.

In the present example, the flexural strength of the formed chips 1d was evaluated. The evaluation of the flexural strength was performed by a three-point bending method. In order to evaluate the effect of the interval expanding step S4, the flexural strength of chips 1d according to a comparative example, which were produced without the interval expanding step S4 being performed, was also evaluated. The evaluation of the flexural strength was performed for each of the chips 1d fabricated using the etchant 60 produced using ammonia water in the etching step S5 and the chips 1d fabricated using the etchant 60 produced using a concentrated sulfuric acid. The evaluation of the flexural strength of the chips 1d was performed by using a compact tabletop tester "EZ Graph" manufactured by Shimadzu Corporation. Then, the flexural strength σ (MPa) of the chips 1d was calculated from the following equation (1). In the following equation (1), L denotes a distance between supporting points, b denotes the width of a chip 1d, and h denotes the thickness of the chip 1d. W denotes a load, and was derived by performing a destructive test on the chip 1d by using the compact tabletop tester. In the present example, a load cell was set at 100 N, and a feed speed was set at 1 mm/sec. In addition, L was set at 2 mm, b was set at 3.84 mm, and h was set at 0.1 mm.

[Math. 1]

$$\delta = \frac{3LW}{2bh^2} \qquad (1)$$

An average flexural strength of the chips 1d according to the comparative example, which were fabricated using the etchant 60 containing ammonia water, was approximately 222 MPa, whereas an average flexural strength of the chips 1d according to the example was approximately 327 MPa. In addition, an average flexural strength of the chips 1d according to the comparative example, which were fabricated using the etchant 60 containing a concentrated sulfuric acid, was 232 MPa, whereas an average flexural strength of the chips 1d according to the example was approximately 554 MPa. In either of the cases of using the etchant 60, as for the flexural strength of the formed chips 1d, the flexural strength of the chips 1d according to the example, which were fabricated by performing the interval expanding step S4, was confirmed to be higher. That is, it has been confirmed that when the intervals between the chips 1d are widened by performing the interval expanding step S4, the etchant 60 enters between the chips 1d easily in the etching step S5, and thus the altered regions 1e formed in the cut surfaces of the chips 1d can be removed appropriately.

Second Example

In a second example, description will be made of a case where a water-soluble liquid resin is used as the protective film 40b. In the second example, description will be made of a case where a GaAs wafer 1 is set as a workpiece, the protective film 40b is formed on the top surface 1a of the wafer 1, and the wafer 1 is cut. Incidentally, an oxide film is formed on the top surface 1a of the wafer 1. In the second example, as in the first example, the frame unit preparing step S1 was performed to form the frame unit 13 by affixing a dicing tape "D765" manufactured by Lintec Corporation as the tape 9 to the undersurface 1b side of the wafer 1 having a metallic film formed on the undersurface 1b side. Next, in the protective film forming step S2, the top surface 1a side of the wafer 1 was coated with "HogoMax003" of a water-soluble protective film material "HOGOMAX (registered trademark)" manufactured by DISCO Corporation as the liquid resin. The drying of the liquid resin, the cutting step S3, and the interval expanding step S4 were performed similarly to the first example.

Next, the etching step S5 was performed. First, the etchant 60 was made by mixing ammonia water with a concentration of 28% to 30%, the ammonia water being manufactured by Kanto Chemical Co., Inc., a hydrogen peroxide solution with a concentration of 30%, the hydrogen peroxide solution being manufactured by Kishida Chemical Co., Ltd., and pure water in a ratio of 1:1:14, and the etchant 60 was prepared in the etching tank 58. Next, the wafer 1 was introduced into the etching tank 58, and the altered regions 1e formed in the cut surfaces of the chips 1d were removed by immersing the wafer 1 in the etchant 60 for 60 seconds. Incidentally, when the etching step S5 was performed, the water-soluble protective film 40b was also removed by the etchant 60. Therefore, a step of removing the protective film 40b was not necessary. In the present example, the oxide film having resistance to the etchant 60 is formed on the top surface 1a of the wafer 1, and therefore the oxide film protects the wafer 1 (chips 1d) from the etchant 60.

In this case, the protective film 40b has a function of preventing processing waste referred to as debris generated from the wafer 1 by the ablation processing performed in the cutting step S3 from adhering to the top surface 1a side of the wafer 1. The protective film 40b is removed together with the processing waste by performing the etching step S5 after the processing waste adheres on the protective film 40b due to the ablation processing. As a result of the above, the chips 1d from which the altered regions 1e had been removed were fabricated.

In the present example, the flexural strength of the formed chips 1d was evaluated. The evaluation of the flexural strength was performed by a three-point bending method as in the first example. In order to evaluate the effect of the interval expanding step S4, the flexural strength of chips 1d according to a comparative example, which were produced without the interval expanding step S4 being performed, was also evaluated. As a result, an average flexural strength of the chips 1d according to the comparative example was approximately 104 MPa, whereas an average flexural strength of the chips 1d according to the present example was approximately 341 MPa. That is, it has been confirmed that when the intervals between the chips 1d are widened by performing the interval expanding step S4, the etchant 60 enters between the chips 1d easily in the etching step S5, and thus the altered regions 1e formed in the cut surfaces of the chips 1d can be removed appropriately.

Third Example

In a third example, description will be made of a case where the top surface 1a side of the wafer 1 is coated with a water-soluble liquid resin by performing the first coating step in the protective film forming step S2, and the top surface 1a side of the wafer 1 is next coated with a water-insoluble liquid resin by performing the second coating step. In the third example, description will be made of a case where a GaAs wafer 1 is set as a workpiece, the protective film 40b is formed on the top surface 1a of the wafer 1, and the wafer 1 is cut. In the third example, as in the first example and the second example, the frame unit preparing step S1 was performed to form the frame unit 13 by affixing a dicing tape "D765" manufactured by Lintec Corporation as the tape 9 to the undersurface 1b side of the wafer 1 having a metallic film formed on the undersurface 1b side.

Next, the protective film forming step S2 was performed. In the first coating step of the protective film forming step S2, the top surface 1a side of the wafer 1 was coated by spin coating with a mixture of "HogoMax003-15" of a water-soluble protective film material "HOGOMAX (registered trademark)" manufactured by DISCO Corporation and water in a ratio of 4:1 as the liquid resin. The spin coating was performed for 120 seconds at a rotational speed of 2500 rpm. Then, in the second coating step of the protective film forming step S2, the top surface 1a side of the wafer 1 was coated with a liquid resin formed by dissolving polyvinyl butyral (PVB) in propylene glycol monomethyl ether (PGME). Solvent Black 3 as a light absorbing agent capable of absorbing light having a wavelength of 532 nm was added to the liquid resin in advance. The coating with the liquid resin was performed by spin coating. The spin coating was performed for 60 seconds at a rotational speed of 2000 rpm.

The water-soluble protective film 40b was formed in the first coating step, and the water-insoluble protective film was formed on the water-soluble protective film 40b in the second coating step. The drying of the liquid resin applied in the protective film forming step S2, the cutting step S3, and the interval expanding step S4 were performed similarly to the first example and the second example. Next, the etching step S5 was performed. First, the etchant 60 was made by mixing ammonia water with a concentration of 28% to 30%, the ammonia water being manufactured by Kanto Chemical Co., Inc., a hydrogen peroxide solution with a concentration of 30%, the hydrogen peroxide solution being manufactured by Kishida Chemical Co., Ltd., and pure water in a ratio of 1:1:14, and the etchant 60 was prepared in the etching tank 58. Next, the wafer 1 was introduced into the etching tank 58, and the altered regions 1e formed in the cut surfaces of the chips 1d were removed by immersing the wafer 1 in the etchant 60 for 120 seconds. Incidentally, because the top surface 1a side of the wafer 1 was protected by the water-insoluble protective film while the etching step S5 was performed, no unexpected damage occurred to the water-soluble protective film 40b and the top surface 1a of the wafer 1.

After the etching step S5 was performed, the protective film removing step was performed. In the protective film removing step, first, two-fluid cleaning was performed which supplied a mixed fluid of pure water and air to the top surface 1a side of the wafer 1. Thereafter, high pressure cleaning was performed which supplied the top surface 1a side of the wafer 1 with pure water under high pressure. In the protective film removing step, high-strength cleaning was performed, and thus the water-soluble protective film 40b protected by the water-insoluble protective film was able to be removed together with the water-insoluble protective film. A step of removing the water-insoluble protective film by using an organic solvent or the like was therefore unnecessary.

In the present example, the water-insoluble protective film was formed on the water-soluble protective film 40b, and thus the wet etching was able to be performed also on the wafer 1 not having a layer resistant to the etchant 60 as the top surface 1a. In addition, the water-insoluble protective film was able to be removed together with the water-soluble protective film 40b without the use of an organic solvent. In addition, it was confirmed that also in a case of performing only high pressure cleaning in the protective film removing step as a modification of the present example, the water-soluble protective film 40b protected by the water-insoluble protective film was able to be removed together with the water-insoluble protective film.

It is to be noted that the present invention is not limited to the description of the foregoing embodiment, but can be modified and carried out in various manners. For example, while description has been made of a case where the protective film forming step S2 and the cutting step S3 are performed after the frame unit preparing step S1 is performed in the foregoing embodiment, one mode of the present invention is not limited to this. That is, the frame unit preparing step S1 may be performed immediately before the interval expanding step S4. That is, the tape 9 may be replaced between the cutting step S3 and the interval expanding step S4. In this case, before the protective film forming step S2 is performed, a frame unit different from the frame unit 13 is formed by using a frame and a tape different from the frame 11 and the tape 9 used in the frame unit preparing step S1. Thereafter, the tape is peeled off the wafer 1 (chips 1d) after the protective film forming step S2 and the cutting step S3 are performed, and the frame 11 and the tape 9 are integrated with the wafer 1 (chips 1d) by performing the frame unit preparing step S1.

In addition, while description has been made of a case where the tape 9 is affixed to the undersurface 1b side of the wafer 1 having the metallic film 7 formed on the undersurface 1b side in the foregoing embodiment, one mode of the present invention is not limited to this. That is, the metallic film 7 may be formed on the top surface 1a side of the wafer 1. Alternatively, the top surface 1a side of the wafer 1 may be oriented downward, and the tape 9 may be affixed to the top surface 1a side.

In addition, while description has been made of a case where ablation processing is performed along the planned dividing lines 3 by applying the laser beam 34b absorbable by the wafer 1 in the cutting step S3 in the foregoing embodiment, one mode of the present invention is not limited to this. That is, the wafer 1 may be cut by another method in the cutting step S3. For example, the frame unit 13 is formed by affixing the tape 9 to the undersurface 1b side of the wafer 1 having the metallic film 7 formed on the top surface 1a side, the protective film 40b is formed on the top surface 1a side, and ablation processing is performed by the laser beam 34b. At this time, a processed groove having a depth not reaching the undersurface 1b of the wafer 1 is formed along the planned dividing lines 3. Next, the wafer 1 is cut by advancing a cutting blade having a width smaller than the width of the processed groove into the processed groove while rotating the cutting blade, and thereby forming a cut groove reaching the undersurface 1b of the wafer 1 from a bottom surface of the processed groove. Also in this case, the flexural strength of the chips 1d can be improved by removing the altered regions occurring in the cut surfaces of the wafer 1 (chips 1d) due to the ablation processing by wet etching. In addition, because the cutting blade is not used for the metallic film 7, a burr or the like does not occur from the cut surfaces, so that the quality of the chips 1d is not degraded.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece processing method of forming chips by dividing a workpiece, the workpiece processing method comprising:
   a frame unit preparing step of preparing a frame unit including the workpiece on which a planned dividing line is set, an extensible tape affixed to one of a top surface and an undersurface of the workpiece, and an annular frame having an opening and an annular region surrounding the opening, an outer peripheral portion of the tape being affixed to the annular region of the annular frame;
   a protective film forming step of forming a protective film by coating another of the top surface and the undersurface of the workpiece with a liquid resin;
   a cutting step of cutting the workpiece along the planned dividing line by irradiating the workpiece with a laser beam along the planned dividing line and forming the device chips after the protective film forming step, wherein altered regions are formed in cut surfaces of the device chips during the cutting step;
   a peeling step of peeling off the tape affixed to one of the top surface and the undersurface of the workpiece, and affixing another tape to one of the top surface and the undersurface of the workpiece;
   an interval expanding step of widening intervals between the chips formed in the cutting step by expanding the tape outward in a radial direction after the cutting step;
   a heating step of heating an annular region of the tape that is exposed between the wafer and the frame to maintain the intervals between the chips; and
   an etching step of removing the altered regions formed in the cut surfaces of the respective chips by application of the laser beam in the cutting step by wet etching after the interval expanding step.

2. A device chip manufacturing method of manufacturing device chips by dividing a wafer, the device chip manufacturing method comprising:
   a frame unit preparing step of preparing a frame unit including the wafer on which a plurality of planned dividing lines intersecting each other are set, the wafer having a device formed on a top surface in each of regions demarcated by the planned dividing lines, an extensible tape affixed to one of the top surface and an undersurface of the wafer, and an annular frame having an opening and an annular region surrounding the opening, an outer peripheral portion of the tape being affixed to the annular region of the annular frame;
   a protective film forming step of forming a protective film by coating another of the top surface and the undersurface of the wafer with a liquid resin;
   a cutting step of cutting the wafer along the planned dividing lines and forming individual device chips by irradiating the wafer with a laser beam along the planned dividing lines after the protective film forming step, wherein altered regions are formed in cut surfaces of the device chips during the cutting step;
   a peeling step of peeling off the tape affixed to one of the top surface and the undersurface of the workpiece, and affixing another tape to affixed to one of the top surface and the undersurface of the workpiece;
   an interval expanding step of widening intervals between the device chips formed in the cutting step by expanding the tape outward in a radial direction after the cutting step;
   a heating step of heating an annular region of the tape that is exposed between the wafer and the frame to maintain the intervals between the chips; and an etching step of removing the altered regions formed in the cut surfaces of the device chips by wet etching after the interval expanding step.

3. The device chip manufacturing method according to claim 2, wherein
the protective film being formed on the other of the top surface and the undersurface in the protective film forming step,
the protective film formed in the protective film forming step has water solubility,
the laser beam applied to the wafer in the cutting step is a laser beam of a wavelength absorbable by the wafer,
in the cutting step, the wafer is cut by ablation processing using the laser beam, and
in the etching step, the protective film is removed by the wet etching.

4. The device chip manufacturing method according to claim 2, wherein
the protective film has resistance to the wet etching, and
in the etching step, the protective film protects the other of the top surface and the undersurface of the wafer from the wet etching.

5. The device chip manufacturing method according to claim 2, wherein the protective film forming step includes
a first coating step of coating the other of the top surface and the undersurface of the wafer with a first liquid resin serving as a material for a water-soluble protective film as the liquid resin, and
a second coating step of coating the other of the top surface and the undersurface of the wafer with a second liquid resin serving as a material for a water-insoluble protective film after the first coating step.

6. The device chip manufacturing method according to claim 2, wherein the wafer includes GaAs.

7. The device chip manufacturing method according to claim 2, wherein the wafer has a metallic film formed on the undersurface.

8. The workpiece processing method according to claim 1, further comprising curing the protective film by heating and drying the liquid resin on the workpiece.

9. The device chip manufacturing method according to claim 2, further comprising curing the protective film by heating and drying the liquid resin on the workpiece.

10. The device chip manufacturing method according to claim 1, wherein the intervals between the chips are expanded to 15 μm to 50 μm in the interval expanding step.

11. The device chip manufacturing method according to claim 2, wherein the intervals between the chips are expanded to 15 μm to 50 μm in the interval expanding step.

* * * * *